US012593757B2

(12) United States Patent
Fan et al.

(10) Patent No.: US 12,593,757 B2
(45) Date of Patent: Apr. 7, 2026

(54) LIGHT-EMITTING DIODE FOR GENERATING A MULTI-PEAK BROADBAND BLUE-VIOLET LIGHT SPECTRUM

(71) Applicant: KAISTAR Lighting(Xiamen) Co., Ltd., Xiamen (CN)

(72) Inventors: Ben-Jie Fan, Xiamen (CN); Hung-Chih Yang, Xiamen (CN); Shuen-Ta Teng, Xiamen (CN)

(73) Assignee: BRIDGELUX OPTOELECTRONICS (XIAMEN) CO., LTD., Xiamen (CN)

( * ) Notice: Subject to any disclaimer, the term of this patent is extended or adjusted under 35 U.S.C. 154(b) by 465 days.

(21) Appl. No.: 18/456,741

(22) Filed: Aug. 28, 2023

(65) Prior Publication Data

US 2024/0114846 A1 Apr. 11, 2024

(30) Foreign Application Priority Data

Sep. 30, 2022 (CN) .......................... 202211209927.7

(51) Int. Cl.
*H10H 20/812* (2025.01)
*A01G 7/04* (2006.01)
*H10H 20/825* (2025.01)

(52) U.S. Cl.
CPC ........... *A01G 7/045* (2013.01); *H10H 20/812* (2025.01); *H10H 20/8252* (2025.01)

(58) Field of Classification Search
CPC ............. H10H 20/812; H10H 20/8242; H10H 20/825; H10H 20/8252; A01G 7/045
See application file for complete search history.

(56) References Cited

U.S. PATENT DOCUMENTS

2023/0163262 A1* 5/2023 Antoniadis ........ H10H 29/8513
257/89

* cited by examiner

*Primary Examiner* — Hoai V Pham
(74) *Attorney, Agent, or Firm* — Hemisphere Law, PLLC

(57) ABSTRACT

A light-emitting diode for plant illumination is provided. The light-emitting diode has a multiple quantum well structure for generating a light beam with a broadband blue-violet light spectrum. The broadband blue-violet light spectrum has a first peak and a second peak within a range from 410 nm to 450 nm, a wavelength value of the second peak is greater than a wavelength value of the first peak, and a difference between the wavelength value of the second peak and the wavelength value of the first peak ranges from 5 nm to 30 nm. The broadband blue-violet light spectrum generated by the light-emitting diode can better match a photosynthetic action spectrum of plants.

10 Claims, 7 Drawing Sheets

LIGHT-EMITTING DIODE FOR GENERATING A MULTI-PEAK BROADBAND BLUE-VIOLET LIGHT SPECTRUM

CROSS-REFERENCE TO RELATED PATENT APPLICATION

This application claims the benefit of priority to China Patent Application No. 202211209927.7, filed on Sep. 30, 2022 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting diode, and more particularly to a light-emitting diode for generating a multi-peak broadband blue-violet light spectrum matching a photosynthetic action spectrum of plants.

BACKGROUND OF THE DISCLOSURE

In the existing plant illumination technology, artificial light environments are used instead of sunlight to ensure healthy growth of plants. Compared to natural light, the advantage of using artificial light for plant illumination lies in controllability, which is reflected by two aspects. The first is environmental controllability. For example, vegetables can be grown in buildings without being affected by weather, and saves area. The second is quality controllability. For example, light recipes can be designed according to different developmental stages of plants for improved growth of the plants and providing sufficient "light fertilization".

Therefore, precisely controlling the light-emitting diode to emit light within a special band in the spectrum to promote absorption of light energy by plants has become one of the important issues in the art.

SUMMARY OF THE DISCLOSURE

In response to the above-referenced technical inadequacies, the present disclosure provides a light-emitting diode capable of generating a multi-peak broadband blue-violet light spectrum that matches a photosynthetic action spectrum of plants.

In one aspect, the present disclosure provides a light-emitting diode for plant illumination, the light-emitting diode has a multiple quantum well structure for generating a light beam with a broadband blue-violet light spectrum. The broadband blue-violet light spectrum has a first peak and a second peak within a range from 410 nm to 450 nm, a wavelength value of the second peak is greater than a wavelength value of the first peak, and a difference between the wavelength value of the second peak and the wavelength value of the first peak ranges from 5 nm to 30 nm.

In some embodiments, the light beam emitted by the light-emitting diode has photosynthetic photon efficacy (PPE) greater than 2.0 µmol/j within a blue-violet wavelength band under operating current densities of 60 mA/mm$^2$ and 120 mA/mm$^2$.

In some embodiments, a ratio of an intensity of the first peak to an intensity of the second peak ranges from 40% to 150%.

In some embodiments, the broadband blue-violet light spectrum also has a second shoulder peak within a wavelength range from 430 nm to 480 nm, a wavelength value of the second shoulder peak is greater than the wavelength value of the second peak, a difference between the wavelength value of the second shoulder peak and the wavelength value of the second peak ranges from 5 to 30 nm, and a ratio of an intensity of the second shoulder peak to the intensity of the second peak is greater than 20% but less than 100%.

In some embodiments, the broadband blue-violet light spectrum also has a first shoulder peak within a wavelength range from 380 nm to 420 nm, a wavelength value of the first shoulder peak is smaller than the wavelength value of the first peak, and a difference between the wavelength value of the first shoulder peak and the wavelength value of the first peak ranges from 0 to 20 nm; and a ratio of an intensity of the first shoulder peak to the intensity of the first peak is greater than 10% but less than 100%.

In some embodiments, the multiple quantum well structure includes m well layers and m+1 barrier layers that are alternately stacked, the multiple quantum well structure is disposed between a P-type semiconductor layer and an N-type semiconductor layer and includes a plurality of second well layers with an indium concentration ranging from 0.07 to 0.12 and a plurality of third well layers with an indium concentration ranging from 0.11 to 0.16, and the indium concentration of the third well layer is greater than the indium concentration of the second well layer, a difference between the indium concentration of the third well layer and the indium concentration of the second well layer ranges from 0.01 to 0.07.

In some embodiments, the multiple quantum well structure further includes at least one fourth well layer with an indium concentration ranging from 0.12 to 0.20, the indium concentration of the fourth well layer is greater than the indium concentration of the third well layers, a difference between the indium concentration of the fourth well layer and the indium concentration of the third well layers ranges from 0.01 to 0.05; and the multiple quantum well structure also includes at least one first well layer with an indium concentration ranging from 0.03 to 0.11, the indium concentration of the at least one first well layer is smaller than the indium concentration of the second well layer, and a difference between the indium concentration of the at least one first well layer and the indium concentration of the second well layer is greater than 0 and less than 0.1.

In some embodiments, at least a first one of the well layers closest to the P-type semiconductor layer is the first well layer, at least two of the well layers that are located at a center of the multiple quantum well structure and close to the P-type semiconductor layer are the second well layers, at least two of the well layers located at a center of the light-emitting stack and close to the N-type semiconductor layer are the third well layers, and at least a first one of the well layers closest to the N-type semiconductor layer is the fourth well layer.

In some embodiments, one of the second well layers is located between two of the third well layers.

In some embodiments, the multiple quantum well structure further includes a plurality of barrier layers that are arranged alternately with the well layers, wherein a material of at least one of the barrier layers includes aluminum gallium nitride.

In some embodiments, the multiple quantum well structure further includes a plurality of barrier layers that are arranged alternately with the well layers, wherein a material of at least one of the barrier layers includes aluminum gallium nitride.

Therefore, in the light-emitting diode for plant illumination provided by the present disclosure, a light beam with a broadband blue-violet light spectrum can be generated by the multiple quantum well structure to achieve a spectrum that matches an absorption spectrum of chlorophyll a in the blue-violet band, and to provide the light-emitting diode with higher photosynthetic photon flux (PPF) and photosynthetic photon efficacy (PPE).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 7 shows a spectrum of a broadband blue-violet light generated by the light-emitting diode according to one embodiment of the present disclosure and an absorption spectrum of chlorophyll a.

DETAILED DESCRIPTION OF THE EXEMPLARY EMBODIMENTS

Figure 1:
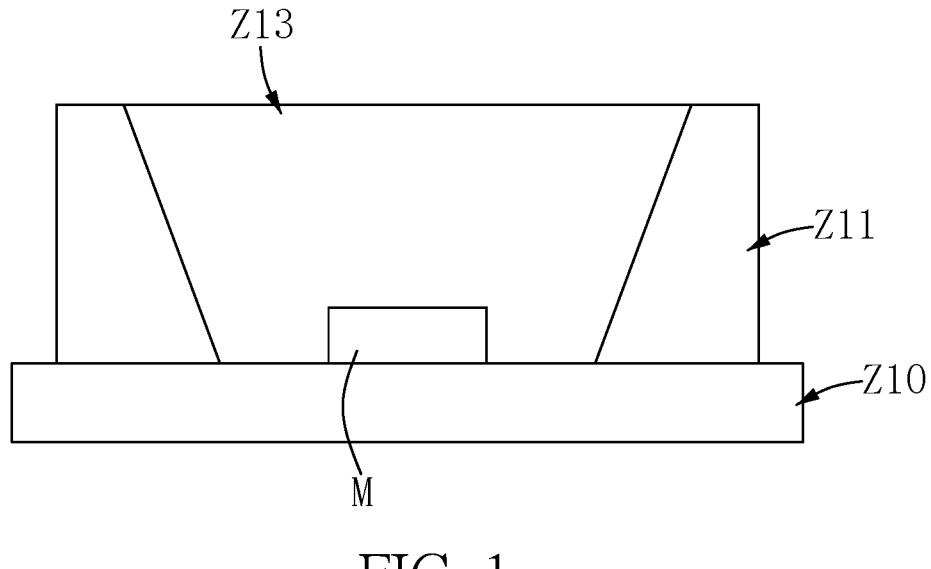
FIG. 1 is schematic cross-sectional view of a light-emitting diode module according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Reference is made to FIG. 1, which is schematic cross-sectional view of a light-emitting diode module according to one embodiment of the present disclosure.

In one embodiment of the present disclosure, a light-emitting diode (LED) module Z1 is used to generate a blue-violet light, and a spectrum of the blue-violet light is close to an absorption spectrum of plants performing photosynthesis in a blue-violet light band (400-500 nm), and has a better PPF. In detail, a main pigment used by plant organisms for photosynthesis is chlorophyll. There are six different types of chlorophyll, with the main types being chlorophyll a and chlorophyll b. 75% of chlorophyll in plants is chlorophyll a, which is the main pigment that captures sunlight for photosynthesis.

As shown in FIG. 1, the LED module Z1 includes a substrate Z10, a reflective component Z11 and a light-emitting component Z12.

The light-emitting component Z12 and the reflective component Z11 are disposed on the substrate Z10, and the light-emitting component Z12 is disposed in a predetermined region on the substrate Z10 and surrounded by the reflective component Z11. In one embodiment, the substrate Z10 may be made of a material with high thermal conductivity, and such material may have high reflectivity and low light transmittance with respect to the visible light, and can be, for example, metal or ceramic.

In some embodiments, the substrate Z10 can further include a high thermal conductivity substrate and a reflective layer disposed on the surface of the high thermal conductivity substrate; however, the present disclosure does not particularly limit the material of the substrate Z10, and the substrate Z10 can be made of a single material or a composite material. In addition, the reflective component Z11 can reflect a light beam generated by the light-emitting component Z12 toward a specific direction.

The light-emitting component Z12 is disposed on a die-bonding region of the substrate Z10 and located in an accommodating space defined by the reflective component Z11. The light-emitting component Z12 is configured to generate beams with a broadband blue-violet light spectrum. A spectrum waveform of the light beam can have a first peak and a second peak, a wavelength difference between the two peaks ranges from 5 nm to 30 nm, and the light beam emitted by the light-emitting diode has photosynthetic photon efficacy (PPE) greater than 2.0 μmol/j within a blue-violet wavelength band under operating current densities of 60 mA/mm$^2$ and 120 mA/mm$^2$. In addition, the light beam emitted by the light-emitting diode has photosynthetic photon flux (PPF) greater than 2.0 μmol/s within the blue-violet wavelength band under an operating current density of 60 mA/mm$^2$, and has a PPF greater than 0.37 μmol/s within the blue-violet wavelength band under an operating current density of 120 mA/mm$^2$.

In one embodiment of the present disclosure, the light-emitting component Z12 can include at least one light-emitting diode to generate the light beam with the broadband blue-violet light spectrum; however, the present disclosure is not limited thereto. In other embodiments of the present disclosure, the light-emitting component Z12 can include a plurality of light-emitting diodes that respectively generate blue light beams and violet light beams with different wavelengths. The blue light beams and the violet light beams with different wavelengths can be mixed to form the aforementioned light beam with the broadband blue-violet spectrum.

Figure 2:
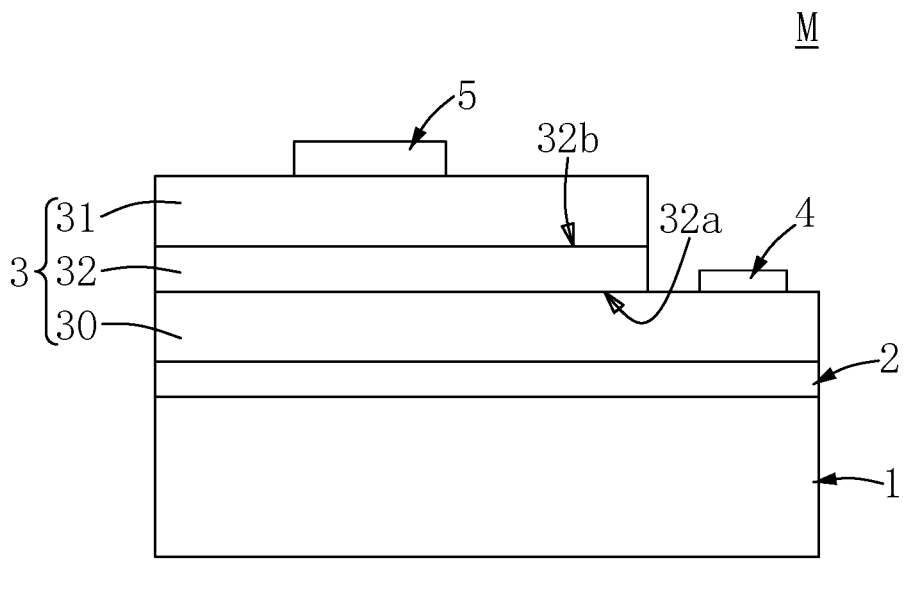
FIG. 2 is a schematic side view showing a structure of a light-emitting diode according to one embodiment of the present disclosure.
Figure 3:
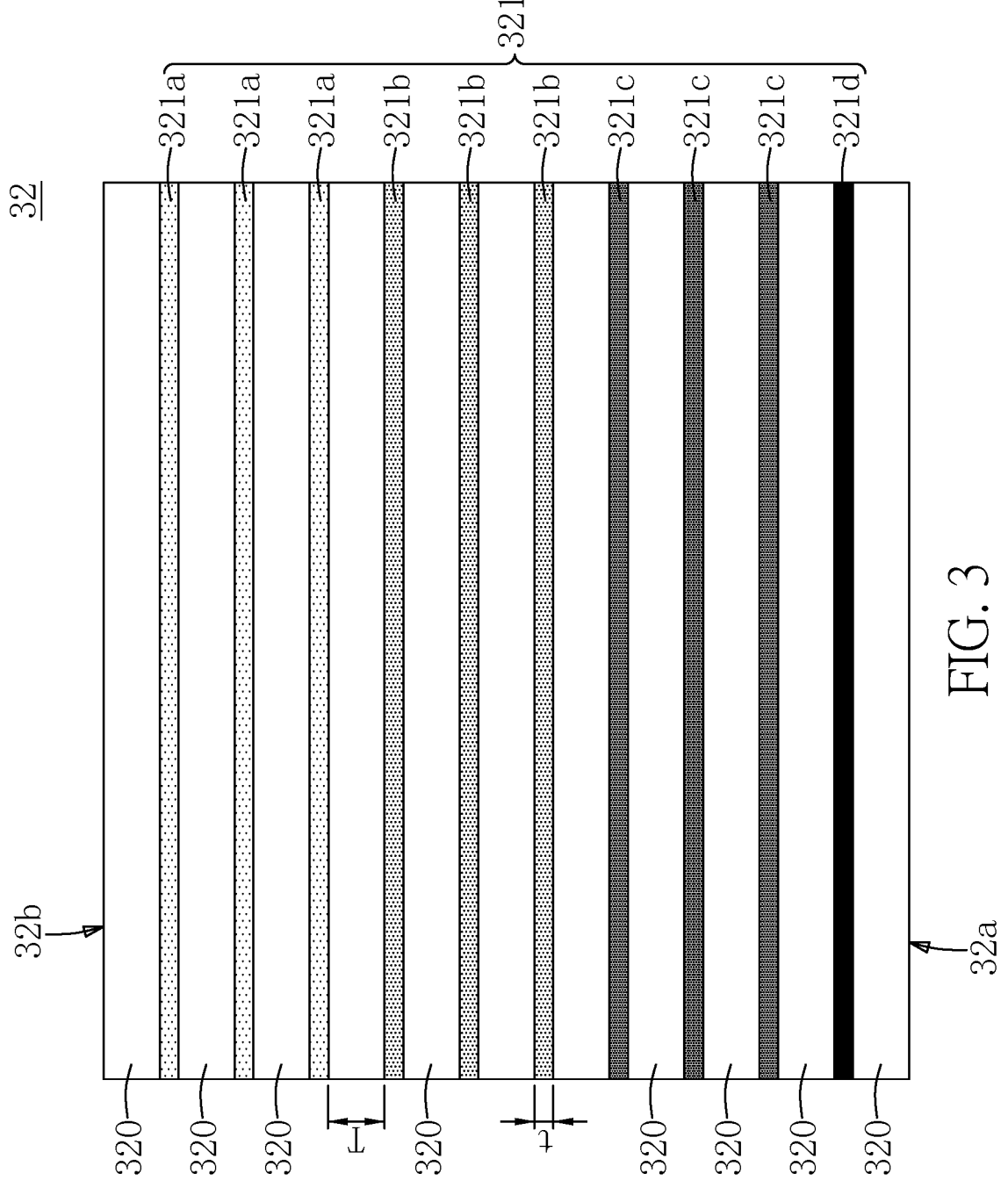
FIG. 3 is a schematic diagram of a light-emitting stack according to a first embodiment of the present disclosure.
Figure 4:
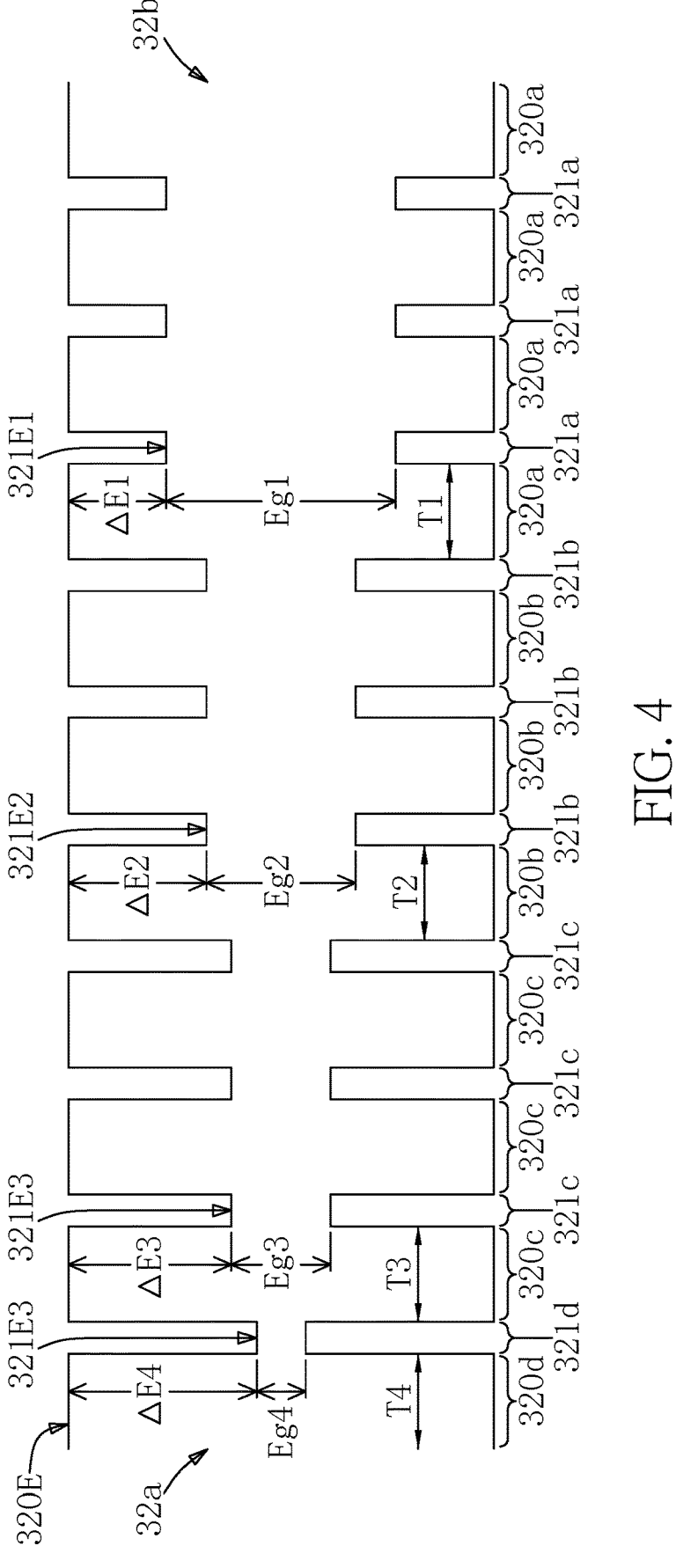
FIG. 4 is a schematic energy band diagram of the light-emitting stack according to the first embodiment of the present disclosure.

Reference is made to FIGS. 2 to 4. FIG. 2 is a schematic side view showing a structure of a light-emitting diode according to one embodiment of the present disclosure. FIG. 3 is a schematic diagram of a light-emitting stack according to a first embodiment of the present disclosure, and FIG. 4 is a schematic energy band diagram of the light-emitting stack according to the first embodiment of the present disclosure.

As shown in FIGS. 2 to 4, a light-emitting diode (LED) M is provided in this embodiment, which can be a blue-violet LED with a multiple quantum well structure. The LED M includes a substrate 1, a buffer layer 2, an epitaxial light-emitting structure 3, a first electrode 4 and the second electrode 5. The substrate 1 can be made of materials suitable for epitaxial growth such as silicon, sapphire, gallium nitride or silicon carbide. In order to achieve lattice matching, a buffer layer 2 is further formed on the substrate 1. In some embodiments, the buffer layer 2 can be formed by an epitaxial process, and has a lattice constant that matches the material of the substrate 1. In one embodiment, the buffer layer 2 can be made of aluminum nitride or gallium nitride. It should be noted that the buffer layer 2 also needs to be selected in consideration of a lattice constant of the material of the epitaxial light-emitting structure 3 to achieve lattice matching.

The epitaxial light-emitting structure 3 can also be formed on the buffer layer 2 by the epitaxial process, and the epitaxial light-emitting structure 3 can include an N-type semiconductor layer 30, a light-emitting stack 32 and a P-type semiconductor layer 31 sequentially disposed on the buffer layer 2.

In addition, the light-emitting stack 32 and the P-type semiconductor layer 31 can have areas smaller than an area of the N-type semiconductor layer 30 without completely covering the N-type semiconductor layer 30, thereby reserving a region for disposing electrodes. The first electrode 4 is arranged on the N-type semiconductor layer 30, and the second electrode 5 is arranged on a portion of the P-type semiconductor layer 31 that is not covered by the light-emitting stack 32 and the P-type semiconductor layer 31, so as to be electrically connected to the N-type semiconductor layer 30 and P-type semiconductor layer 31, respectively. Moreover, the first electrode 4 and the second electrode 5 can be electrically connected to a light source control circuit.

The N-type semiconductor layer 30 and the P-type semiconductor layer 31 are respectively an electron supply layer for supplying electrons and a hole supply layer for supplying holes. It should be noted that the material of the N-type semiconductor layer 30 can be, for example, a compound semiconductor material with a direct energy gap, such as silicon-doped gallium nitride. In addition, the material of the P-type semiconductor layer 31 is gallium nitride doped with magnesium or aluminum gallium nitride doped with magnesium.

The light-emitting stack 32 is used to generate a broadband blue-violet light spectrum, and can be, for example, located between the N-type semiconductor layer 30 and the P-type semiconductor layer 31 and have a first surface 32a close to the N-type semiconductor layer 30 and a second surface 32b close to the second surface 32b of the P-type semiconductor layer 31.

When the light source control circuit supplies voltages to the first electrode 4 and the second electrode 5, a current passing through the epitaxial light-emitting structure 3 can be generated, and a bias between the first electrode 4 and the second electrode 5 make the light-emitting stack 32 generate a light beam with a specific wavelength band, and a light intensity of the light beam can be adjusted by controlling the current. In the present embodiment, the light-emitting stack 32 can generate a blue-violet light spectrum with multiple peaks by applying the bias.

In one embodiment of the present disclosure, to avoid wasting light energy as much as possible while allowing the light-emitting diode M to be provided with a higher PPF in plant illumination, a specific design (see below for details) of the multiple quantum well structure is utilized for the light-emitting stack 32 to generate the blue-violet light spectrum that is as close as possible to an absorption spectrum of chlorophyll a in a wavelength band preferably ranging from 410 nm to 460 nm. In a preferred embodiment, the blue-violet light spectrum has a first peak and a second peak within a wavelength range from 410 nm to 440 nm. A wavelength value of the second peak is greater than a wavelength value of the first peak, and a difference between the wavelength value of the second peak and the wavelength value of the first peak ranges from 5 nm to 30 nm.

Considering wavelength and intensity distributions of peaks of the photosynthetic action spectrum of plants, a ratio of an intensity of the first peak to an intensity of the second peak ranges from 40% to 150%. Moreover, in one preferred embodiment of the present disclosure, the ratio of the intensity of the first peak to the intensity of the second peak ranges from 60% to 130%.

On the other hand, in order to make the generated blue-violet light spectrum have a higher PPF value, the broadband blue-violet light spectrum generated by the light-emitting stack 32 is designed to have a second shoulder in a wavelength range from 430 nm to 480 nm. A wavelength value of the second shoulder peak is greater than the wavelength value of the second peak. For the wavelength range, a difference between the wavelength value of the second shoulder peak and the wavelength value of the second peak can range from 5 nm to 30 nm. A ratio of an intensity of the second shoulder to the intensity of the second peak is greater than 20% and less than 100%.

Further, in order to better regulate intensities of the first peak and the second peak of the generated blue-violet light spectrum, and to make the blue-violet light spectrum have better stability under a varying current and under cold and hot states, the generated blue-violet light spectrum is designed to have a first shoulder peak within a range from 380 nm to 420 nm, and preferably within a range from 400 nm to 420 nm. A wavelength value of the first shoulder peak is smaller than the wavelength value of the first peak, and a difference between the wavelength value of the first shoulder peak and the wavelength value of the first peak can range from 0 to 20 nm. A ratio of an intensity of the first shoulder peak to the intensity of the first peak can be greater than 10% but less than 100%. However, it should be noted that an existence of the first shoulder peak is not meant to limit the present disclosure, and the first shoulder peak may not be recognized since a position or intensity thereof may be too close to the first peak.

Reference is made to FIGS. 3 and FIG. 4. FIG. 3 is a schematic diagram of a light-emitting stack according to a first embodiment of the present disclosure, and FIG. 4 is a schematic energy band diagram of the light-emitting stack according to the first embodiment of the present disclosure. In this embodiment, the light-emitting stack 32 includes a multiple quantum well structure, and the multiple quantum well structure can include a plurality of barrier layers 320 and a plurality of well layers 321 that are alternately stacked. As shown in FIG. 3, each barrier layer 320 has a thickness T, and each well layer 321 has a thickness t. In some embodiments, the thickness T can be greater than the thickness t of any well layer 321. It should be noted that the thickness T of the barrier layer 320 and the thickness t of the well layer 321 are related to a spectral profile of the blue-violet light spectrum generated by the light-emitting stack 32. In one embodiment, in order to achieve the aforementioned condition of the blue-violet light spectrum, the thickness T of the barrier layer 320 is greater than 4 nm. Optionally, the thickness of the barrier layer 320 ranges from 5 nm to 15 nm. In addition, the thickness t of the well layer 321 ranges from 2 nm to 5 nm, and the material of the well layer 321 is $In_xGa_{1-x}N$. In addition, the present disclosure does not limit that the thickness T of each barrier layer 320 must be the same, nor does it limit that the thickness t of each well layer 321 must be the same; that is, the barrier layers 320 can have different thicknesses from each other, and the well layers 321 can also have thicknesses different from each other.

On the other hand, the multiple quantum well structure can include m well layers 321 and m+1 barrier layers 320 that are stacked alternately and disposed between the P-type semiconductor layer 31 and the N-type semiconductor layer 30, where m is an integer greater than 0. In other words, layers that is in direct contact with the P-type semiconductor layer 31 and the N-type semiconductor layer 30 are the barrier layers 320.

In this embodiment, the well layers 321 can have various different energy band gaps, so as to generate the broadband blue-violet light spectrum. The well layers 321 can include one or more of at least one first well layer 321a, at least one second well layer 321b, at least one third well layer 321c, and at least one fourth well layer 321d. In addition, differences among the first well layer 321a, the second well layer 321b, the third well layer 321c and the fourth well layer 321d basically lie in the energy band gap formed therein; however, thicknesses of the first well layer 321a, the second well layer 321b, the third well layer 321c and the fourth well layer 321d can also affect the spectral profile of the blue-violet light spectrum. In one specific embodiment, an energy band gap Eg1 of the first well layer 321a is greater than an energy band gap Eg2 of the second well layer 321b, and the energy band gap Eg2 of the second well layer 321b is greater than an energy band gap Eg3 of the third well layer 321c, and the energy band gap Eg3 of the third well layer 321c is greater than an energy band gap Eg4 of the fourth well layer 321d.

It should be noted that the energy band gaps of the well layers 321 affect the wavelength of the generated light beam. According to recombination mechanism of electrons and holes, when the energy band gaps of the well layers 321 are larger, a wavelength of a light beam generated by the electron-hole pairs that are recombined under such energy band gap can be smaller. Therefore, when the energy band gaps are different, light beams with different wavelengths are also generated. In this embodiment, the first well layer 321a can be used to generate a first sub-light beam with a first wavelength, the second well layer 321b can be used to generate a second sub-light beam with a second wavelength, and the third well layer 321c can be used to generate a third sub-light beam with a third wavelength, the fourth well layer 321d can be used to generate a fourth sub-light beam with a fourth wavelength. In addition, since the energy band gap Eg1 is greater than the energy band gap Eg2, the energy band gap Eg2 is greater than the energy band gap Eg3, and the energy band gap Eg3 is greater than the energy band gap Eg4; therefore, the first wavelength, the second wavelength, the third wavelength and the fourth wavelength are put in ascending order. It should be noted that the well layer 321 can preferably include at least the first well layer 321a, the second well layer 321b, and the third well layer 321c, or at least include the first well layer 321a, the second well layer 321b, and the fourth well layer 321d. The reason is that if a quantity of types of the well layers 321 is less than or equal to two, there may be a large difference between the blue-violet light spectra in the cold-state and the hot-state. Similarly, if a quantity of types of the well layers 321 is less than or equal to two, there may be a large difference for the blue-violet light spectrum under different operating currents. That is to say, the quantity of types of the well layers 321 that is less than or equal to two may lead to poor thermal stability and current stability.

It should be further explained that, when a quantity of the well layers 321 is increased from a center of the light-emitting stack 32 toward the first surface 32a (for example, a quantity of the third well layers 321c and the fourth well layers 321d is increased), better intensity distribution can be obtained. When the quantity of well layers 321 is increased from the center of the light-emitting stack 32 toward the second surface 32b (for example, a quantity of the first well layers 321a and the second well layers 321b is increased), better stability in the cold-state and in the hot-state can be obtained.

In one embodiment, a difference range between the first wavelength and the second wavelength ranges from 0 nm to 40 nm, a difference range between the second wavelength and the third wavelength ranges from 5 nm to 30 nm, and a difference range between the fourth wavelength and the second wavelength ranges from 10 nm to 50 nm. In an optional embodiment, the difference range between the first wavelength and the second wavelength ranges from 0 nm to 20 nm, the difference range between the second wavelength and the third wavelength ranges from 5 nm to 20 nm, and the difference range between the fourth wavelength and the second wavelength ranges from 15 nm to 45 nm. Therefore, when the well layers 321 have different energy band gaps, adjustments on the wavelengths of any two of the first sub-light beam, the second sub-light beam, the third sub-light beam and the fourth sub-light beam (e.g., the first and second wavelengths, the first and third wavelengths or the second and third wavelengths) will affect a spectrum waveform of the broadband blue-violet light spectrum.

Furthermore, in the present embodiment, the barrier layers 320 can be gallium nitride (GaN) layers or aluminum gallium nitride (AlGaN) layers, and the well layers 321 can be indium gallium nitride ($In_xGa_{1-x}N$) layers. Since indium concentrations of the well layers 321 affect the energy band gaps of the well layers 321, the energy band gaps of the well layers 321 can be adjusted by controlling content of indium component in each well layer, thereby affecting wavelengths of lights emitted by the well layers 321. Specifically, the lower the indium concentration, the larger the energy band gap of the well layer 321. In addition to the indium concentrations, positions, sequence, quantity of the well layers 321 and thickness of the corresponding barrier layers 320 all affect the spectrum waveform. In addition to the above-mentioned materials, the barrier layers 320 can also be various stacked combinations of AlGaN and GaN (for example, combinations of AlGaN/GaN, GaN/AlGaN, GaN/AlGaN/GaN, AlGaN/GaN AlGaN).

In some embodiments, the multiple quantum well structure includes a plurality of second well layers with an indium concentration ranging from 0.07 to 0.12 and a plurality of third well layers with an indium concentration ranging from 0.11 to 0.16. The indium concentration of the third well layer is greater than the indium concentration of the second well layer, and a difference between the indium concentration of the third well layer and the indium concentration of the second well layer ranges from 0.01 to 0.07. That is to say, an indium component concentration in the second well layer ranges from 7% to 12%, an indium component concentration in the third well layer ranges from 11% to 16%, and a difference between the indium component concentrations of the second well layer and the third well layer ranges from 1% to 7%. In a preferred embodiment, the multiple quantum well structure includes a plurality of second well layers with an indium concentration ranging from 0.09 to 0.12 and a plurality of third well layers with an indium concentration ranging from 0.11 to 0.14, and a difference between the indium concentration of the third well layer and the indium concentration of the second well layer ranges from 0.01 to 0.05.

In addition, in some embodiments, the multiple quantum well structure further includes at least one fourth well layer with an indium concentration ranging from 0.12 to 0.20, and the indium concentration of the fourth well layer preferably ranges from 0.12 to 0.17. That is to say, the indium component concentration in the at least one fourth well layer ranges from 12% to 20%, and preferably ranges from 12% to 17%.

Furthermore, the indium concentration of the fourth well layer is greater than the indium concentration of the third well layer, and a difference between the indium concentration of the fourth well layer and the indium concentration of the third well layer ranges from 0.01 to 0.05, and preferably ranges from 0.01 to 0.03. That is to say, the difference between the indium component concentrations in the fourth well layer and the third well layer ranges from 1% to 5%, and preferably ranges from 1% to 3%. The multiple quantum well structure also includes at least one first well layer with an indium concentration ranging from 0.03 to 0.11, that is, an indium component concentration ranging from 3% to 11%. The indium concentration of the at least one first well layer preferably ranges from 0.07 to 0.11, that is, the indium component concentration ranges from 7% to 11%. The indium concentration of the first well layer is lower than the indium concentration of the second well layer, and a difference between the indium concentration of the first well layer and the indium concentration of the second well layer is greater than 0 and less than 0.1, preferably greater than 0 and less than 0.05. That is, a difference between the indium component concentration of the first well layer and the indium component concentration of the second well layer is greater than 0% and less than 10%, and preferably greater than 0% and less than 5%.

In one embodiment, the indium component concentration in the first well layer ranges from 3% to 11%, the indium component concentration in the second well layer ranges from 7% to 12%, the indium component concentration in the third well layer ranges from 11% to 16%, and the indium component concentration in the fourth well layer ranges from 12% to 20%.

Accordingly, the first wavelength of the first sub-light beam generated by the first well layer 321a can fall within a range from 380 nm to 420 nm. The second wavelength of the second sub-light beam generated by the second well layer 321b can fall within a range from 410 nm to 430 nm. The third wavelength of the third sub-light beam generated by the third well layer 321c can fall within a range from 420 nm to 450 nm. The fourth wavelength of the fourth sub-light beam generated by the fourth well layer 321d can fall within a range from 430 nm to 480 nm. It should be noted that the indium component concentrations and the corresponding wavelength ranges all affect the broadband blue-violet light spectrum generated by the light-emitting stack 32.

In an alternative embodiment, the indium component concentration in the first well layer ranges from 7% to 11%, the indium component concentration in the second well layer ranges from 9% to 12%, the indium component concentration in the third well layer ranges from 11% to 14%, and the indium component concentration in the fourth well layer ranges from 12% to 17%. It should be noted that the indium component concentrations in the well layers 321 can be adjusted through different growth temperatures, such that the well layers 321 can be provided with different energy band gaps Eg1 to Eg4, respectively.

In the embodiment of the present disclosure, to generate the broadband blue-violet light spectrum that matches the photosynthetic action spectrum of plants, the present disclosure designs differences among the indium component concentrations to ensure optional combinations of energy band gaps. In some embodiments, when the well layers 321 are all indium gallium nitride ($In_xGa_{1-x}N$ layers, the difference between the indium component concentration in the first well layer 321a and the indium component concentration in the second well layer 321b ranges from 0% to 10%, the difference between the indium component concentration in the second well layer 321b and the indium component concentration in the third well layer 321c ranges from 1% to 7%, and the difference between the indium component concentration in the fourth well layer 321d and the indium component concentration in the second well layer 321b ranges from 1% to 10%.

In an optional embodiment, when the well layers 321 are all indium gallium nitride ($In_xGa_{1-x}N$) layers, the difference between the indium component concentration in the first well layer 321a and the indium component concentration in the second well layer 321b ranges from 0% to 5%, the difference between the indium component concentration in the second well layer 321b and the indium component concentration in the third well layer 321c ranges from 1% to 5%, and the difference between the indium component concentration in the fourth well layer 321d and the indium component concentration in the second well layer 321b ranges from 2% to 5%. Therefore, by progressively adjusting and controlling the indium concentrations, the positions, the sequence, the quantity of the well layers 321, the thicknesses of the corresponding barrier layers 320, the indium component concentrations and the differences among the indium component concentrations, the broadband blue-violet light spectrum generated by the light-emitting stack 32 will be affected, such that the broadband blue-violet light spectrum can better match the photosynthetic action spectrum of plants. Therefore, under the above conditions, the first wavelength of the first sub-light beam generated by the first well layer 321a can fall within a range from 400 nm to 420 nm. The second wavelength of the second sub-light beam generated by the second well layer 321b can fall within a range from 410 nm to 425 nm. The third wavelength of the third sub-light beam generated by the third well layer 321c can fall within a range from 420 nm to 440 nm. The fourth wavelength of the fourth sub-light beam generated by the fourth well layer 321d can fall within a range from 430 nm to 460 nm.

Reference is made to FIG. 4, a first barrier height $\Delta E1$ is formed between a conductive band 321E1 of the first well layer 321a and a conduction band 320E of the barrier layer 320. A second barrier height $\Delta E2$ is formed between a conduction band 321E2 of the second well layer 321b and the conduction band 320E of the barrier layer 320. A third barrier height $\Delta E3$ is formed between a conduction band 321E3 of the third well layer 321c and the conduction band 320E of the barrier layer 320. A fourth barrier height $\Delta E4$ is formed between a conduction band 321E4 of the fourth well layer 321d and the conduction band 320E of the barrier layer 320.

The fourth barrier height $\Delta E4$ is greater than the third barrier height $\Delta E3$, the third barrier height $\Delta E3$ is greater than the second barrier height $\Delta E2$, and the second barrier height $\Delta E2$ is greater than the first barrier height $\Delta E1$. Therefore, compared with the first well layer 321a, electrons are easier to be confined in the second well layer 321b and the third well layer 321c, thereby generating more light beams with the second wavelength and the third wavelength.

Accordingly, in one embodiment, the quantity of the fourth well layers 321d is equal to or less than the quantity of the first well layers 321a, less than the quantity of the second well layers 321b, and less than the quantity of the third well layers 321c, so as to prevent intensities of the light beams with the first wavelength, the second wavelength and the third wavelength in the spectrum from being too low.

In addition, in the embodiment of the present disclosure, the well layer 321 closest to the P-type semiconductor layer 31 is at least the first well layer 321a.

In this embodiment, at least the first two layers of the well layers 321 closest to the P-type semiconductor layer 31, that is, the first two layers of the well layers 321 closest to the second surface 32b, are all first well layers 321a, which can be used to improve light intensities on the left side of the spectrum, so as to increase a width from the left side of the spectrum.

In addition, at least two of the well layers 321 located at the center of the light-emitting stack 32 and close to the N-type semiconductor layer 30 are the third well layers 321c, and at least two of the well layers 321 located at the center of the light-emitting stack 32 and close to the P-type semiconductor layer 31 are the second well layers 321b, and the well layer 321 closest to the N-type semiconductor layer 30 is the fourth well layer 321d.

It should be noted that energy of the second well layer 321b is relatively high in the spectrum; therefore, the second well layer 321b can be mainly used to provide main light intensity, and a main function of the third well layer 321c is similar to that of the second well layer 321b. With the existence of the third well layers 321c, the broadband blue-violet light spectrum generated can better match an absorption orientation of chlorophyll a.

On the other hand, the well layer 321 closest to the N-type semiconductor layer 30 is the fourth well layer 321d, which can be used to increase an intensity on the right side of the spectrum to increase the width from the right side, such that the spectrum can be more suitable for the absorption spectrum of chlorophyll a in the longer wavelength region.

In addition, as shown in FIG. 4, the barrier layers 320 can include a plurality of first barrier layers 320a, a plurality of second barrier layers 320b, a plurality of third barrier layers 320c, and a fourth barrier layer 320d. The first barrier layers 320a and the first well layers 321a are alternately stacked, the second barrier layers 320b and the second well layers 321b are alternately stacked, the third barrier layers 320c and the third well layers 321c are alternately stacked, and the fourth barrier layer 320d is disposed adjacent to the fourth well layer 321d. It should be noted that each of the barrier layers 320 can be provided with a single-layered barrier structure or a multi-layered barrier structure. In this embodiment, the single-layered barrier structure is utilized, and the material of the barrier layer 320 can include gallium nitride or aluminum gallium nitride.

It is worth mentioning that the present disclosure does not particularly limit an arrangement continuity of the second well layer 321b and the third well layer 321c. For example, this embodiment does not limit that all of the second well layers 321b must be adjacently arranged, nor does it limit that all of the third well layers 321c must be adjacently arranged. That is, in one specific embodiment, one of the second well layers 321b can be located between two of the third well layers 321c. For example, in FIG. 4, the positions of the adjacent second well layer 321b and the third well layer 312c can be interchanged without overly affecting the broadband blue-violet light spectrum that the LED M can generate.

In addition, in this embodiment, a thickness T1 of the first barrier layers 320a, a thickness T2 of the second barrier layers 320b, a thickness T3 of the third barrier layers 320c and a thickness T4 of the fourth barrier layer 320d are substantially the same, but optionally, the thicknesses T2, T3 and T4 can be greater than or equal to the thickness T1. In some embodiments, the thickness T2 ranges from 1 to 2 times the thickness T1, the thickness T3 ranges from 1 to 2 times the thickness T1, and the thickness T4 ranges from 1 to 2 times the thickness T1.

Moreover, in an optional embodiment, the thickness T1 ranges from 5 to 15 nm, and the thickness of the well layer 321 ranges from 2 to 5 nm. Compared with the existing plant illumination technique, the generated broadband blue-violet light spectrum provided in the present embodiment can more closely match the photosynthetic action spectrum of plants.

Figure 5:
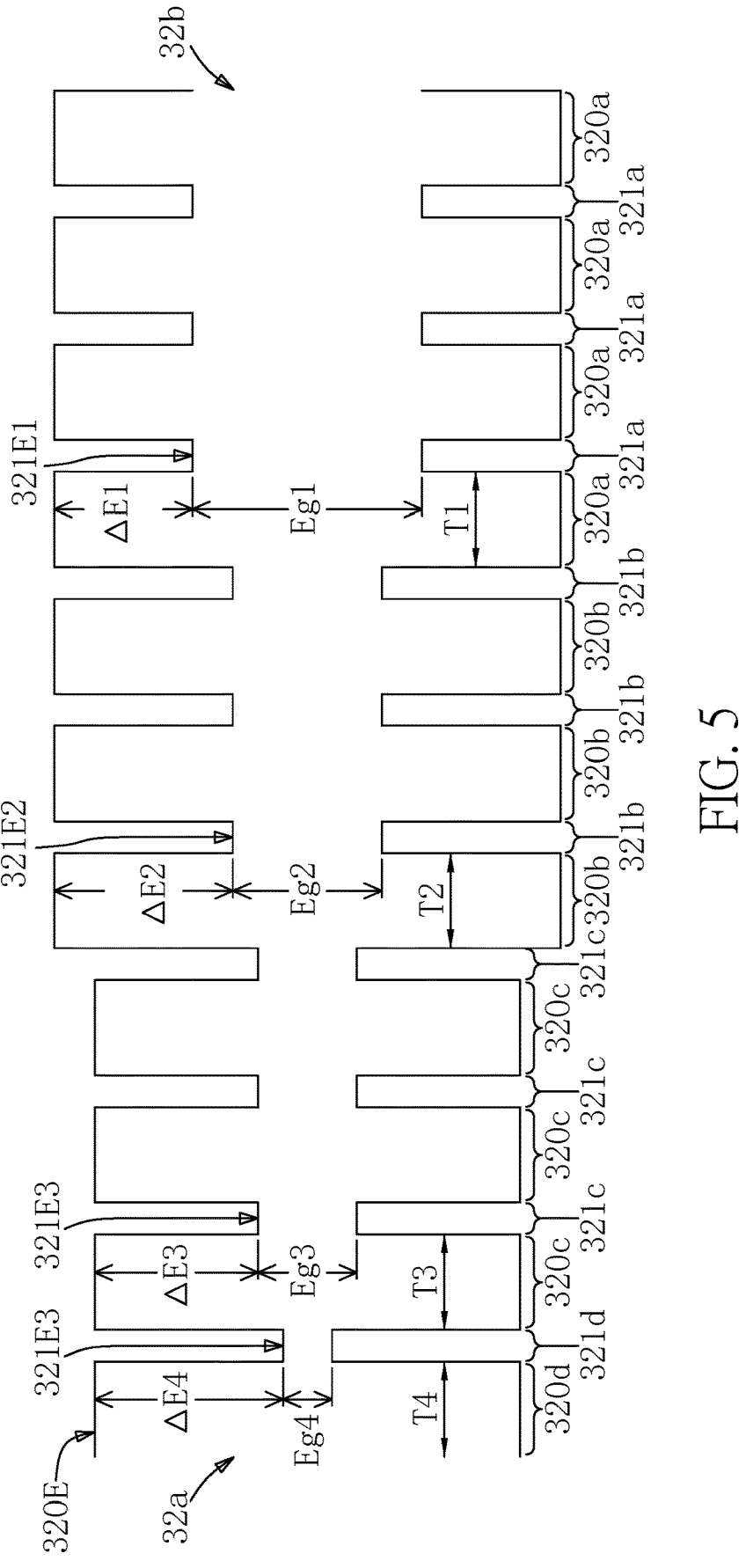
FIG. 5 is a schematic energy band diagram of a light-emitting stack according to a second embodiment of the present disclosure.

Reference is made to FIG. 5. FIG. 5 is a schematic energy band diagram of a light-emitting stack according to a second embodiment of the present disclosure. Components in this embodiment that are the same as those in the embodiment of FIG. 4 have the same reference numerals. Compared with the previous embodiment, the first barrier layer 320a and the second barrier layer 320b in this embodiment use the same material, but are different from the materials used in the third barrier layer 320c and the fourth barrier layer 320d.

Specifically, the first barrier layers 320a and the second barrier layers 320 are made of aluminum gallium nitride, and the third barrier layers 320c and the fourth barrier layers 320d are made of gallium nitride. Therefore, the first barrier height $\Delta E1$ and the second barrier height $\Delta E2$ close to the P-type semiconductor layer 31 are increased, which also increases the difficulty for electrons to move between the second barrier layer 320b and the third barrier layer 320c, thereby increasing recombination probabilities for the electrons in this region. Therefore, the electrons are more likely to be confined in the second well layer 321*b*, thereby generating more light beams with the second wavelength.

It should be noted that although gallium nitride and aluminum gallium nitride are utilized in this embodiment, materials of the same type with different concentrations can be used according to the same energy band gap structure. For example, aluminum gallium nitride ($Al_xGa_{1-x}N$) can be utilized, in which x represents aluminum component concentration. Therefore, an energy band gap structure similar to that of FIG. 5 can be obtained by controlling the aluminum component concentrations, and then the LED M capable of generating a similar broadband blue-violet light spectrum can be obtained.

Figure 6:
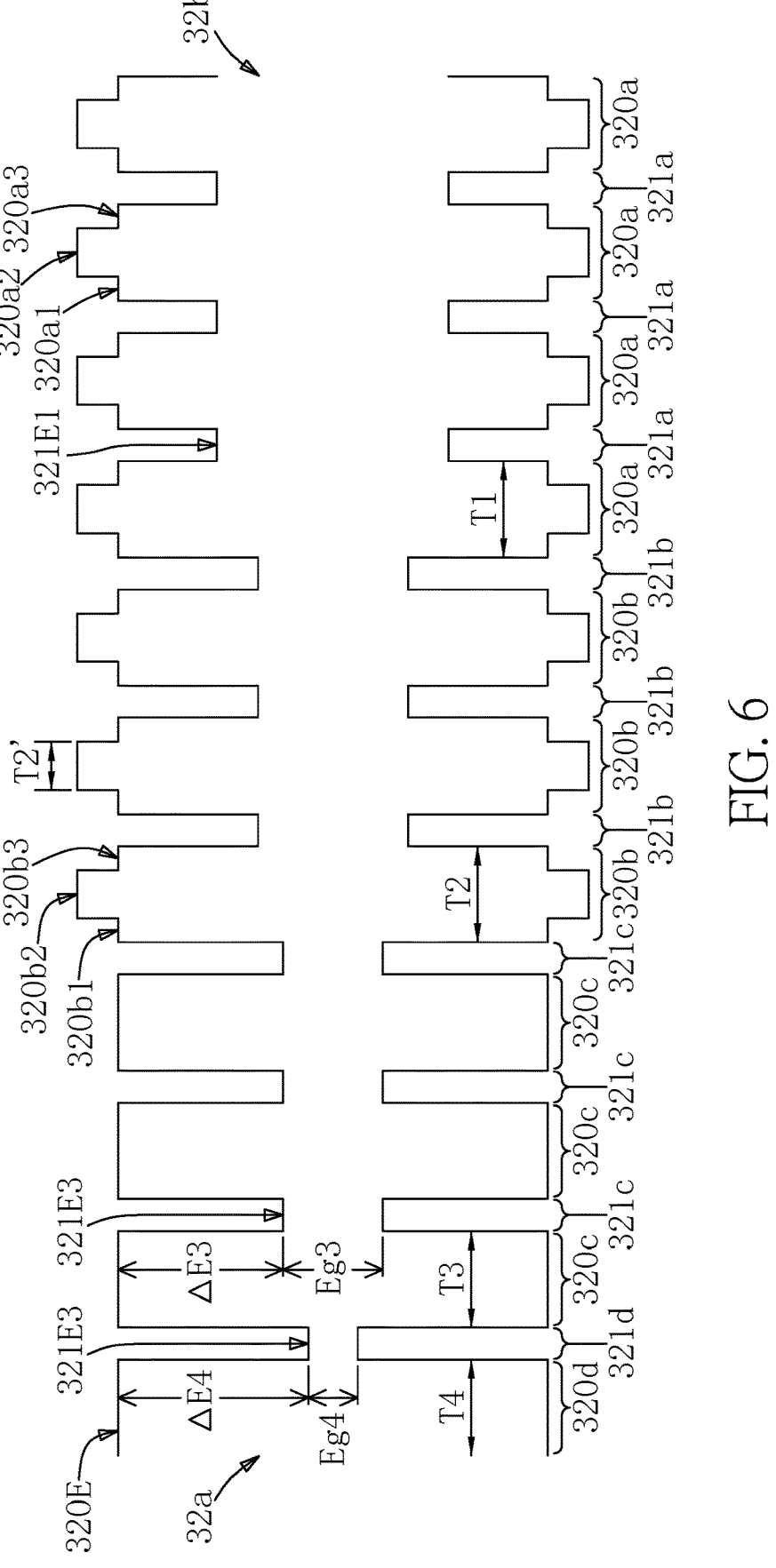
FIG. 6 is a schematic energy band diagram of a light-emitting stack according to a third embodiment of the present disclosure.

Reference is made to FIG. 6. FIG. 6 is a schematic energy band diagram of a light-emitting stack according to a third embodiment of the present disclosure. Components in this embodiment that are the same as those in the embodiment of FIGS. 4 and 5 have the same reference numerals. Compared with the previous embodiments, a part of the first barrier layers 320*a* and the second barrier layer 320*b* in this embodiment use the multi-layered barrier structure. In the multi-layered barrier structure, the barrier layer can be composed of one or more of gallium nitride and aluminum gallium nitride to form a multilayer structure. As shown in FIG. 6, the first barrier layer 320*a* is divided into sub-layers 320*a*1, 320*a*2 and 320*a*3, which are sequentially composed of GaN layer, AlGaN layer and GaN layer. Similarly, the second barrier layer 320*b* is divided into sub-layers 320*b*1, 320*b*2 and 320*b*3, which are sequentially composed of GaN layer, AlGaN layer and GaN layer.

In this embodiment, the AlGaN layer in the multi-layered barrier structure can be thicker than the GaN layer, but the present disclosure is not limited thereto. In an optional embodiment, a thickness T2' of the AlGaN layer ranges from 2 nm to 10 nm.

Specifically, similar to the foregoing embodiments, the third barrier layer 320*c* and the fourth barrier layer 320*d* are made of gallium nitride, while the first barrier layer 320*a* and the second barrier layer 320*b* are formed by multi-layered barrier structure composed of GaN layer, AlGaN layer and GaN layer. The AlGaN layer formed between the two GaN layers can be used as an electron blocking layer to reduce moving speed of electrons passing by, in other words, it can further increase a barrier height for the electrons to move to the P-type semiconductor layer 31. Since the AlGaN layer increases the energy required for electrons to cross the barrier, the recombination probability can be increased. In this case, more light beams with the first wavelength and the second wavelength can be generated, and the intensities of the first sub-light beam and the second sub-light beam can be increased.

Figure 7:
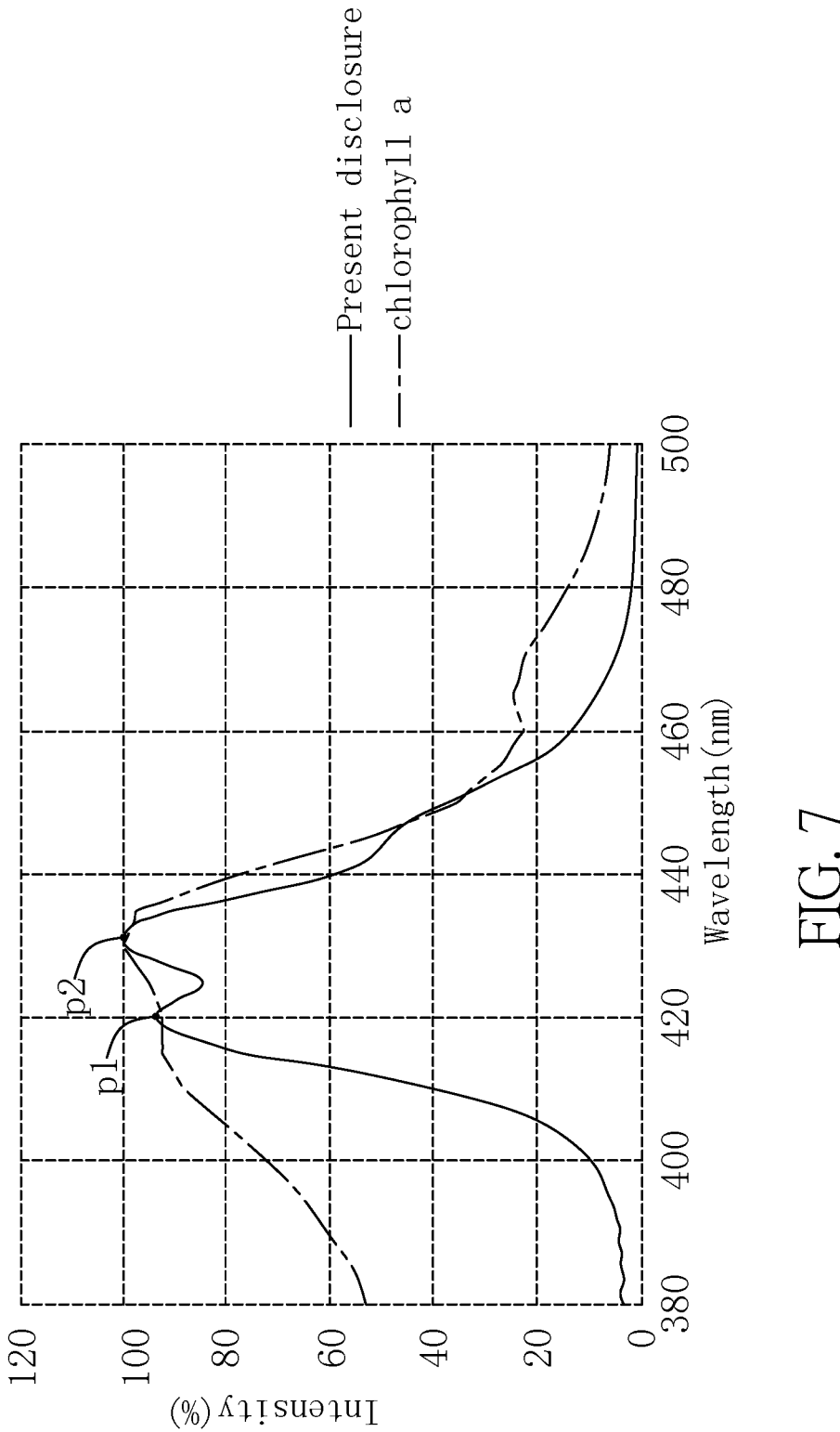

Reference is made to FIG. 7, which shows a spectrum of a broadband blue-violet light generated by the light-emitting diode according to one embodiment of the present disclosure and an absorption spectrum of chlorophyll a. Through the above-mentioned techniques, the light-emitting stack 32 of the embodiment of the present disclosure can be used to generate a broadband blue-violet light spectrum, and the generated spectrum has two peaks and two shoulder peaks.

In FIG. 7, the LED of the present disclosure can generate the broadband blue-violet light spectrum, which has two peaks p1 and p2, and a first shoulder peak and a second shoulder peak. The first shoulder peak is located at the shorter wavelength region on the left side of the peak p1, and there is no obvious peak or inflection point, while the second shoulder is located at the longer wavelength region on the right side of the peak p2, and is formed at a relatively obvious inflection point between the second shoulder peak and the second peak.

In detail, the peak p1 corresponds to the second sub-light beam generated by the second well layer 321*b*, and falls in a range from 410 nm to 425 nm. On the other hand, the peak p2 corresponds to the third wavelength of the third sub-light beam generated by the third well layer 321*c*, and can fall within a range of 420 nm to 440 nm. In some embodiments, a difference range between the second wavelength and the third wavelength ranges from 5 nm to 30 nm.

In addition, the first wavelength of the first sub-light beam generated by the first well layers 321*a* can fall in a range from 380 nm to 420 nm, but there is no obvious peak or inflection point, and the first well layers 321*a* are only used to increase the width on the left side of the peak p1, and the fourth wavelength of the fourth sub-light beam generated by the fourth well layer 321*d* can fall in a range from 430 nm to 460 nm, which can be used to make a shape on the right side of the peak p2 fit closer against an inflection feature on the right side of the absorption spectrum of the chlorophyll a. In some embodiments, the difference between the first wavelength and the second wavelength ranges from 0 nm to 40 nm, and the difference between the fourth wavelength and the second wavelength ranges from 10 nm to 50 nm. Furthermore, in some embodiments, an intensity range of the first sub-light beam is 10% to 100% of an intensity of the third sub-light beam, an intensity range of the second sub-light beam is 40% to 150% of an intensity of the third sub-light beam, and an intensity range of the fourth sub-light beam is 0% to 120% of the intensity of the third sub-light beam.

In an optional embodiment, a difference range between the first wavelength and the second wavelength ranges from 0 nm to 20 nm, a difference range between the second wavelength and the third wavelength ranges from 5 nm to 20 nm, a difference range between the fourth wavelength and the second wavelength ranges from 15 nm to 45 nm, the intensity range of the first sub-light beam ranges from 30% to 80% of the intensity of the third sub-light beam, the intensity range of the second sub-light beam ranges from 60% to 130% of the intensity of the third sub-light beam, and the intensity range of the fourth sub-light beam ranges from 20% to 100% of the intensity of the third sub-light beam. Based on the aforementioned techniques, the light-emitting stack 32 can generate the broadband blue-violet light spectrum that better matches the photosynthetic action spectrum of plants.

It is worth noting that in the LED general lighting, a luminous index is usually measured by a radiant power and a luminous flux, while in plant lighting, the luminous index thereof is often measured by photosynthetic photon flux (PPF) or photosynthetic photon efficacy (PPE), in which the PPF can be calculated by the following equation:

$$PPF = \int_{500}^{600} \frac{P_\lambda \lambda \times 10^6}{hc \times N_a} d\lambda; \qquad \text{equation (1)}$$

where $P_\lambda$ is the radiation flux of the LED, $N_a$ is Avogadro's constant, h is Planck's constant, and the PPE can be further obtained by dividing the PPF by an input electric power.

The unit of PPF is micromoles per second (μmol/s), and the unit of PPE is micromoles per joule (μmol/j). PPF is greatly affected by current, and PPE is usually used as an indicator for more reference. Reference is made to Table 1 below, which shows the PPF and PPE of the LEDs in the blue-violet light band (400-500 nm) according to various embodiments of the present disclosure.

| operating current density | 65 mA/mm$^2$ | | 120 mA/mm$^2$ | |
|---|---|---|---|---|
| | PPF($\mu$mol/s) | PPE($\mu$mol/J) | PPF($\mu$mol/s) | PPE($\mu$mol/J) |
| Case 1 | 0.212 | 2.265 | 0.377 | 2.122 |
| Case 2 | 0.209 | 2.217 | 0.380 | 2.127 |
| Case 3 | 0.212 | 2.260 | 0.386 | 2.168 |
| Case 4 | 0.205 | 2.175 | 0.375 | 2.093 |

Case 1 corresponds to the energy band gap structure of FIG. 5, case 2 corresponds to the energy band gap structure of FIG. 6, case 3 corresponds to the energy band gap structure of FIG. 4, and case 4 is another energy band gap structure obtained by interchanging positions of the adjacent second well layer 321*b* and the third well layer 312*c* of FIG. 4. Table 1 shows that the light beams emitted by the LEDs in the various embodiments of the present disclosure have the PPE greater than 2.0 $\mu$mol/j within the blue-violet wavelength band (400 to 500 nm) under operating current densities of 60 mA/mm$^2$ and 120 mA/mm$^2$. Therefore, the broadband blue-violet light spectrum generated by the LED provided in the present disclosure not only matches the photosynthetic action spectrum of plants in appearance, but also ensures a luminous intensity that promotes the absorption of light energy by plants.

In conclusion, in the LED for plant illumination provided by the present disclosure, a light beam with a broadband blue-violet light spectrum can be generated by the multiple quantum well structure to achieve a spectrum that matches an absorption spectrum of chlorophyll a in the blue-violet band, and to provide the light-emitting diode with higher photosynthetic photon flux (PPF) and photosynthetic photon efficacy (PPE).

In addition, in the LED for plant lighting provided by the embodiment of the present disclosure, due to the use of the well layers with different energy band gaps, the multi-layered barrier structure, and the limitations of specific differences among the indium component concentrations, it can be ensured that the optional combinations of energy band gaps can generate a broadband blue-violet light spectrum that closely matches features of the photosynthetic action spectrum of plants.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode for plant illumination, the light-emitting diode having a multiple quantum well structure for generating a light beam with a broadband blue-violet light spectrum, wherein the broadband blue-violet light spectrum has a first peak and a second peak within a range from 410 nm to 450 nm, a wavelength value of the second peak is greater than a wavelength value of the first peak, and a difference between the wavelength value of the second peak and the wavelength value of the first peak ranges from 5 nm to 30 nm.

2. The light-emitting diode according to claim 1, wherein the light beam emitted by the light-emitting diode has a photosynthetic photon efficacy (PPE) greater than 2.0 $\mu$mol/j within a blue-violet wavelength band under operating current densities of 60 mA/mm2 and 120 mA/mm2.

3. The light-emitting diode according to claim 1, wherein a ratio of an intensity of the first peak to an intensity of the second peak ranges from 40% to 150%.

4. The light-emitting diode according to claim 1, wherein the broadband blue-violet light spectrum also has a second shoulder peak within a wavelength range from 430 nm to 480 nm, and a wavelength value of the second shoulder peak is greater than the wavelength value of the second peak, and a difference between the wavelength value of the second shoulder peak and the wavelength value of the second peak ranges from 5 to 30 nm; wherein a ratio of an intensity of the second shoulder peak to the intensity of the second peak is greater than 20% but less than 100%.

5. The light-emitting diode according to claim 1, wherein the broadband blue-violet light spectrum also has a first shoulder peak within a wavelength range from 380 nm to 420 nm, a wavelength value of the first shoulder peak is smaller than the wavelength value of the first peak, and a difference between the wavelength value of the first shoulder peak and the wavelength value of the first peak ranges from 0 to 20 nm; wherein a ratio of an intensity of the first shoulder peak to the intensity of the first peak is greater than 10% but less than 100%.

6. The light-emitting diode according to claim 1, wherein the multiple quantum well structure includes m well layers and m+1 barrier layers that are alternately stacked, the multiple quantum well structure is disposed between a P-type semiconductor layer and an N-type semiconductor layer and includes a plurality of second well layers and a plurality of third well layers, wherein the indium concentration of the third well layer is greater than the indium concentration of the second well layer.

7. The light-emitting diode according to claim 6, wherein the multiple quantum well structure further includes at least one fourth well layer, the indium concentration of the fourth well layer is greater than the indium concentration of the third well layers; and wherein the multiple quantum well structure also includes at least one first well layer, the indium concentration of the at least one first well layer is smaller than the indium concentration of the second well layer.

8. The light-emitting diode according to claim 7, wherein at least a first one of the well layers closest to the P-type semiconductor layer is the first well layer, at least two of the well layers that are located at a center of the multiple quantum well structure and close to the P-type semiconductor layer are the second well layers, at least two of the well layers located at a center of the light-emitting stack and close to the N-type semiconductor layer are the third well layers, and at least a first one of the well layers closest to the N-type semiconductor layer is the fourth well layer.

9. The light-emitting diode according to claim 8, wherein one of the second well layers is located between two of the third well layers.

10. The light-emitting diode according to claim 6, wherein the multiple quantum well structure further includes a plurality of barrier layers that are arranged alternately with the well layers, wherein a material of at least one of the barrier layers includes aluminum gallium nitride.

\*   \*   \*   \*   \*